United States Patent [19]

Shideler et al.

[11] Patent Number: 4,624,046

[45] Date of Patent: Nov. 25, 1986

[54] OXIDE ISOLATION PROCESS FOR STANDARD RAM/PROM AND LATERAL PNP CELL RAM

[75] Inventors: Jay A. Shideler, San Mateo; Umeshwar D. Mishra, Sunnyvale, both of Calif.

[73] Assignee: Fairchild Camera & Instrument Corp., Cupertino, Calif.

[21] Appl. No.: 770,355

[22] Filed: Aug. 27, 1985

Related U.S. Application Data

[63] Continuation of Ser. No. 336,802, Jan. 4, 1982, abandoned.

[51] Int. Cl.[4] .................. H01L 21/265; H01L 29/72; H01L 21/225
[52] U.S. Cl. .................................... 29/576 B; 29/571; 29/577 C; 29/578; 148/1.5; 148/187; 148/DIG. 10; 357/34; 357/91
[58] Field of Search ............ 29/576 B, 571, 578, 29/577 C; 148/1.5, 187; 357/34, 91

[56] References Cited

U.S. PATENT DOCUMENTS

| | | | |
|---|---|---|---|
| 3,648,125 | 3/1972 | Peltzer | 317/235 |
| 3,733,690 | 5/1973 | Rizzi et al. | 357/45 |
| 3,742,592 | 7/1973 | Rizzi et al. | 357/45 |
| 3,848,238 | 11/1974 | Rizzi et al. | 357/45 |
| 3,904,450 | 9/1975 | Evans et al. | 148/1.5 |
| 3,971,058 | 7/1976 | Fagan et al. | 365/179 |
| 4,066,473 | 1/1978 | O'Brien | 357/49 |
| 4,110,779 | 8/1978 | Rathbone et al. | 357/49 |
| 4,111,724 | 9/1978 | Ogiue et al. | 357/49 |
| 4,115,797 | 9/1978 | Hingarh et al. | 357/35 |
| 4,122,542 | 10/1978 | Camerik et al. | 365/156 |
| 4,149,177 | 4/1979 | Alter | 357/46 |
| 4,175,983 | 11/1979 | Schwabe | 357/91 |
| 4,199,378 | 4/1980 | van Gils | 357/91 |
| 4,242,791 | 1/1981 | Horng et al. | 357/90 |
| 4,255,674 | 3/1981 | Grenier et al. | 357/36 |
| 4,314,359 | 2/1982 | Kato et al. | 357/63 |
| 4,318,751 | 3/1982 | Horng | 357/50 |
| 4,339,767 | 7/1982 | Horng et al. | 357/50 |
| 4,372,030 | 2/1983 | Saitoh | 29/569 R |
| 4,373,252 | 2/1983 | Caldwell | 357/91 |
| 4,387,445 | 6/1983 | Denis et al. | 365/179 |
| 4,392,149 | 7/1983 | Horng et al. | 357/49 |
| 4,412,376 | 11/1983 | De Bar et al. | 29/576 B |
| 4,418,468 | 12/1983 | Vora et al. | 357/92 |
| 4,434,433 | 2/1984 | Nishizawa | 357/13 |
| 4,441,932 | 4/1984 | Akasaka et al. | 148/1.5 |
| 4,477,965 | 10/1984 | Blossfeld | 29/576 B |
| 4,485,552 | 12/1984 | Magdo et al. | 29/577 C |

FOREIGN PATENT DOCUMENTS

| | | |
|---|---|---|
| 0001300 | 7/1978 | European Pat. Off. |
| 0004298 | 2/1979 | European Pat. Off. |
| 0028306 | 9/1980 | European Pat. Off. |
| 2369652 | 10/1976 | France |
| 2334198 | 11/1976 | France |

*Primary Examiner*—Upendra Roy
*Attorney, Agent, or Firm*—Carl Silverman; David H. Carroll; Alan H. MacPherson

[57] ABSTRACT

An oxide-isolated RAM and PROM process is disclosed wherein a RAM circuit includes a lateral PNP transistor formed in the same island of silicon material as a vertical NPN device and further wherein contact is made to the base of the lateral PNP and to the collector of the vertical NPN through a buried contact region accessed through a sink region formed in an adjacent island of semiconductor material. A field implantation beneath the isolation oxide avoids implanting impurity along the sidewalls of the semiconductor material adjacent the field oxidation and therefore provides both vertical and lateral isolation from one silicon island to another. Substantial reductions in sink sizes and cell sizes are obtained by elminating the field diffusions from the sidewalls of the semiconductor islands. The lateral PNP transistor serves as an active load for a memory circuit constructed using the structure of this invention. The process also can be used to manufacutre PROMS from vertical NPN transistors. An $LV_{CEO}$ implant is used to increase the breakdown voltage of each vertical transistor from its collector-to-emitter thereby allowing junction avalanching of selected emitter-base junctions to program selected PROMs in the array even though the programming voltage is only a few volts beneath the breakdown voltage of the oxide isolated structure.

8 Claims, 22 Drawing Figures

NiCr TO VERTICAL FUSE COMPARISON

NiCr | Z.E.

SCHEMATIC

LAYOUT

FIG. 5a — CURRENT RAMP WITH VOLTAGE SENSE
$T_{PH} = 1-5 \mu s$
$T_{PW} = 250 \mu s$

FIG. 5b — VOLTAGE DROP WHEN CELL IS PROGRAMMED

OXIDE ISOLATION PROCESS FOR STANDARD RAM/PROM AND LATERAL PNP CELL RAM

This application is a continuation of application Ser. No. 06/336,802 filed Jan. 4, 1982 now abandoned.

BACKGROUND OF THE INVENTION

1. Field of the Invention

This invention relates to bipolar random access memories (often called "RAMs") and bipolar programmable read-only memories (often called "PROMs") and in particular to a structure wherein an epitaxial layer of one conductivity type is used with a substrate of opposite conductivity type together with oxide isolation thereby allowing Schottky diodes and transistors to be used in RAMs, and junction-programmable PROMs to be made in an oxide isolated structure and to a process for making these structures.

2. Prior Art

Various ways have been proposed to isolate electrically a plurality of pockets of semiconductor material in each of which one or more circuit elements can be formed. A number of these techniques are summarized in the introduction to U.S. Pat. No. 3,648,125 issued Mar. 7, 1972 on an invention of Peltzer. Two goals of these various isolation methods have been to reduce the size of the isolation regions as a proportion of the total area of silicon available for the formation of active devices and to decrease the size of the active devices. A major improvement in packing density over the packing densities achieved by the disclosures of these prior art patents was achieved by the method and structure disclosed by Peltzer wherein a thin silicon epitaxial layer was subdivided into electrically isolated pockets by a grid of oxidized regions of the epitaxial silicon material extending through the epitaxial material to an underlying laterally-extending isolation PN junction. Peltzer recognized that the use of diffused regions for isolation and for the formation of active semiconductor devices resulted in larger, less well-defined circuits than desired for many applications. Therefore, Peltzer replaced the diffused isolation regions with field oxide.

Among the different types of semiconductor devices which have been fabricated using the Peltzer oxide isolation technique are bipolar memories and programmable read-only memories. Programmable read-only memories are well-known in the semiconductor arts. One of the first patents disclosing a programmable semiconductor memory was Price U.S. Pat. No. 3,191,151 issued June 22, 1965 disclosing a programmable diode array. The Price array comprised a plurality of pairs of two diodes connected back-to-back. The array was programmed by sending a current pulse of the proper magnitude and direction through selected ones of the back-to-back diodes thereby destroying the junction of each of these back-biased diodes without affecting the connected forward-biased diode. The pulse converted the junction of each selected back-biased diode to a short circuit. Price also disclosed the use of a fuse which when destroyed converted the circuit from conducting to non-conducting. Additional patents disclosing programmable read-only memories include U.S. Pat. Nos. 3,733,690; 3,742,592; and 3,848,238. These patents disclose a programmable read-only memory also using avalanche breakdown to program selected devices and a method for achieving avalanche breakdown as in the Price U.S. Pat. No. 3,191,151.

However, heretofore it has not been feasible to combine the avalanche breakdown of a PN junction with the recessed oxide isolation structure of the prior art to yield a programmable read only memory programmable by avalanche breakdown of a PN junction because the voltages required to break down such a junction were close to the breakdown voltages of oxide isolated structures.

SUMMARY OF THE INVENTION

This invention turns to advantage certain of the features of the prior art oxide isolation process to provide a structure which is particularly useful in the manufacture of random access memories (RAMs) and programmable read-only memories (PROMs). In accordance with this invention, the same process can be used to manufacture either a RAM product or a PROM product. In accordance with this invention, the breakdown voltages associated with prior art recessed oxide isolation structures and particularly the sidewall regions of the isolated semiconductor islands adjacent the recessed oxide are substantially increased by using an N type epitaxial layer on a P type substrate and turning to advantage the pile up of N type impurities adjacent the recessed oxide during thermal oxidation of the epitaxial layer and by preventing P type impurities used to form channel stops in the field of the device from reaching the sidewalls of the silicon islands. In addition, the collector-emitter breakdown voltage ($LV_{CEO}$) of NPN vertical transistors formed in the semiconductor islands when this process is used to make PROMs is increased by implanting a P type impurity in those portions of the silicon islands to be occupied by the P type base regions of the NPN vertical transistors.

In one embodiment of this invention, a PROM is made from a plurality of transistors each having an emitter, a floating base and a collector, wherein the emitter-base junction of each of selected transistors is destroyed by a programming current, thereby eliminating the need for prior art fuses (such as NICHROME fuses) and the extra processing and yield difficulties associated with the nichrome process. This invention also allows the use of fuses for "redundant" type RAMs.

In accordance with this invention, one structure suitable for manufacture of both RAMs and PROMs is made by a process which forms an N type epitaxial layer on a P type substrate containing a buried collector layer, then forms an oxide layer and then a nitride layer over the surface of the epitaxial layer, etches grooves into the epitaxial layer where the field oxide is to be formed, ion implants the channel stop regions over the bottoms of the grooves such that the channel stop dopant remains off the sidewall of the groove by making use of silicon nitride as an ion implant mask, forms field oxide in the grooves of the device, and forms active regions in the islands of semiconductor material covered, during the formation of the field implant, by the silicon nitride wherein a base exclusion mask (typically a multipurpose photoresist) masks out the implant to allow the formation of certain devices in the epitaxial layer. Thus high value resistors (which may be, for example, implanted or epitaxial) of use in standard RAM circuits, lateral PNP base regions, and sinks (either "soft" or "hard") for all RAMs and PROMs are formed through the exclusion of the P type implanted dopant from the regions of the N type epitaxial layer in which the N type high value resistors, the N type base regions in the PNP lateral transistors and the N type sinks for all RAMs and PROMs are to be formed. The thick field oxide excludes the P type implanted dopant from the grooves. As a feature of this invention, the collector sinks can remain "soft" (that is, no significant amount of an N type impurity is diffused or implanted through the N type epitaxial layer to the underlying N+ collector contact or "buried" layer) when RAMs and PROMS are to be fabricated. However, if desired, an N type impurity can be diffused in the sink area through to the N plus buried layer to achieve lower resistivity for circuit requirements. As an additional feature of this invention, Schottky devices can be formed for use in both RAMs and PROMs.

In accordance with one embodiment of this invention, in a vertical transistor, arsenic emitters are implanted into an implanted base region such that only the leading edge of the base region protrudes past the emitter. The result is a much shallower base with a very high gradient for fast transit times in an NPN vertical transistor. When using arsenic implanted emitters, the P type base profile may be of higher concentration and greater gradient than when the emitters are phosphorus diffused. As well as increasing transistor transit times, this gives higher transistor efficiency and therefore higher beta. As another feature of this invention, an upside down processing can be used to implant a P plus region into the buried layer before the growth of the epitaxial layer.

The fuses for use in a PROM device are walled emitter transistors (that is, transistors the emitter regions of which are laterally defined by the recessed isolation or "field" oxide) which are avalanched so as to break down the emitter-base junction.

This invention departs from the prior art in several respects. First, it provides a ten (10) mask process for use in manufacturing oxide isolated RAMs and ROMs as opposed to the prior art processes requiring more masks than ten (10) and typically thirteen (13) masks. This invention provides the first RAM cell using oxide isolation and a lateral PNP device, thereby achieving a substantial improvement in packing density over the prior art processes. Moreover, this invention allows the manufacture of both PROMs and RAMs using a single process. By eliminating the field predeposition in the sidewall, the sink can be made smaller whether or not it is hard or soft. Finally, a Schottky TTL can be used in a RAM cell with significant improvements in speed.

This invention will be more fully understood in conjunction with the following detailed description taken together with the following drawings (which, for illustrative purposes, are not drawn to scale).

DESCRIPTION OF THE DRAWINGS

FIG. 4b shows in top view a PROM cell similar to that shown in cross-section in FIG. 4a.

FIG. 4c shows in top view another embodiment of a PROM cell of FIG. 4a.

DETAILED DESCRIPTION

The following description is intended to be illustrative only and is not intended to limit the scope of the invention. While one set of conductivity types is shown, it should be understood that for many applications these conductivity types can be reversed.

The starting material for the process comprises a P type silicon substrate of either $<100>$ or $<111>$ crystallographic structure ($<100>$ is preferred but $<111>$ has been successfully used) having a resistivity of between 1.5 and 3.0 ohms-cm or higher. Using a lower resistivity substrate of about 0.2 to 0.4 ohms-cm or less tends to degrade or ruin the vertical isolation in the to-be-formed epitaxial layers by outdiffusion of P type dopant from the substrate. With this in mind, other substrate resistivities can be used, as appropriate. The substrate 11 (FIG. 1) is precleaned and inspected and then oxidized at about 1000° C. using a standard thermal oxidation process to form an oxide layer on at least one surface of the substrate to a thickness of about 8,000 Å. The bare backside of the wafer is then back sanded in a well-known manner to assist in gettering certain metallic impurities during subsequent processing. The wafer is again cleaned in a well-known manner and inspected and then a first mask is used to define the openings in the oxide through which an impurity will be diffused to form the buried layers (such as buried layer 12 in FIG. 1) of the device. An opening is then etched through the oxide using a standard HF etch and buried layer 12 is formed by diffusing at 1245° C. antimony dopant through the opening in the oxide. Buried layer 12 is of N+ conductivity type when the substrate 11 is of P type conductivity, as shown, and has a surface resistance (V/I) of about 5.0 to 9.0 ohms.

Figure 1:
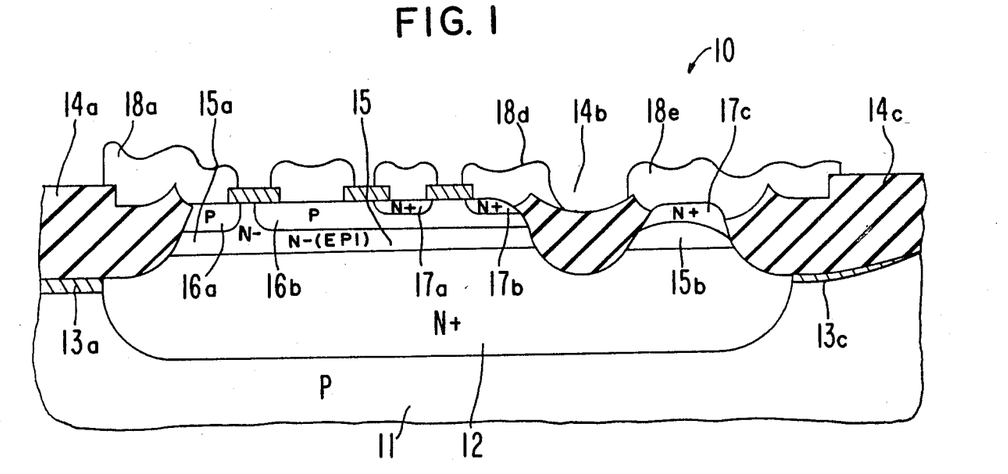
FIG. 1 illustrates a portion of a cross-section of a device structure fabricated in accordance with this invention.

Following formation of buried layer 12, the oxide is removed from the surface of substrate 11, the wafer is cleaned and inspected and an N type epitaxial layer 15 is formed on its surface using standard epitaxial growth techniques involving the decomposition of silane, silicon tetrachloride, or dichlorosilane. Dichlorosilane is preferred. The epitaxial layer is formed to a thickness of about 1.5 microns and has a resistivity of 0.4 to 0.6 ohm-cm.

Following the formation of epitaxial layer 15, the wafer is again cleaned and inspected. Two different types of oxide-nitride layers can be formed on epitaxial layer 15 (shown as layer 25 in FIGS. 2a to 2d and as layer 43 in FIG. 4a). The first comprises a thin silicon oxide layer (200 Å) thermally-grown on the epitaxial layer 15 followed by the deposition of a thin silicon nitride layer (1100 Å). This thin "epi-ox-thin-nitride" sandwich is used to form channel stops with very low energy implants of 15 KEV boron in the to-be-formed grooves. The second comprises a thick sandwich including a thick thermal oxide layer 24 (400 Å) formed on the epitaxial layer together with a thick silicon nitride layer 26 (1500 Å). This second layer is used when the channel stop is to be implanted using 20 KEV boron. The advantage of using the thicker oxide-nitride layer (and this thicker layer is preferred) is that it is much more economical to implant the channel stops with a 20 KEV implant than it is with a 15 KEV implant because beam currents fall off dramatically when operating an ion implanter at lower energies. The 400 Å oxide layer is formed at 1000° C. by using five minutes of $N_2$, thirty minutes of dry $O_2$ and five minutes of $N_2$. A nitride layer of about 1500 Å thickness is then formed using low pressure chemical vapor deposition involving the decomposition of dichlorosilane ($SiH_2Cl_2$) and ammonia ($NH_3$). As an alternative, either thick or thin oxide layers can be interchanged with thick or thin nitride layers.

The nitride layer 26 is then immediately oxidized (60 minutes in 1000° C. steam) to form a thin silicon dioxide layer (not shown for simplicity) of about 50 Å on top of the nitride to serve as a mask to define the isolation grooves to be formed in the underlying epitaxial layer. Photoresist is used to define the oxide on the nitride and this exposed oxide is then removed by placing the wafer in a hydrofluoric etch of well-known constituents for about sixty (60) seconds to expose the underlying nitride. The nitride 26 exposed by removing the thin 50 Å oxide layer is then etched using a well-known phosphoric acid etch at 160° C. for sixty (60) minutes to expose portions of the underlying oxide layer 24.

As an alternative to the use of phosphoric acid to etch the nitride 26, the formation of a 50 Å layer of oxide on top of the nitride 26 can be omitted and in lieu thereof the photoresist mask can be used as a direct mask for plasma etching of the nitride. This saves one step in the process and allows dry processing to be used.

Figure 2A:
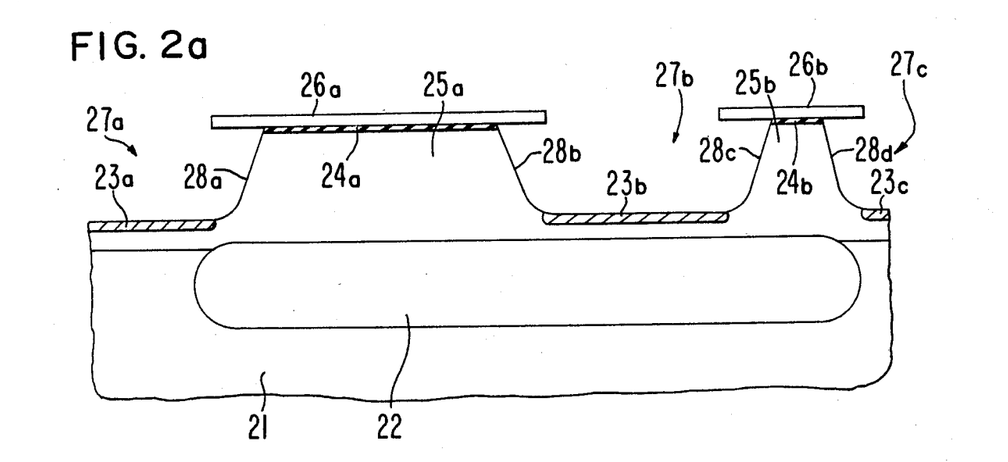
FIG. 2a illustrates in cross-section a portion of the device structure of FIG. 1 during an intermedidate stage of its manufacture.

The exposed oxide 24 beneath the previously removed nitride 26 is then etched and removed using a well-known buffered HF etchant for about 60 seconds followed by a rinse in deionized water and an acetic acid dip and a 10 to 1 HF dip. Silicon 25 is then etched in a well-known manner to form grooves in the silicon of about 6,000-8,000 Å thick, (preferably about 7,500 Å∓500 Å). The etching of the silicon 25 removes silicon underlying the silicon nitride mask 26a, 26b as shown in FIG. 2a (note that the ends of this mask protrude over the edges 28a, 28b, 28c and 28d of grooves 27a, 27b formed in the epitaxial silioon 25 and thus protect the underlying edges 28a, 28b, 28c and 28d of silicon islands 25a and 25b from the impurity to be implanted into the bottoms of grooves 27a, 27b, 27c to form channel stops 23a, 23b and 23c). This allows vertical isolation between the well-known channel stops 23a, 23b and 23c and the active devices formed in islands 25a and 25b. A typical implant dose for the boron ions used to form the channel stop regions 23a, 23b, 23c is $1.5 \times 10^{14}$ ions/cm$^2$ at 20 KEV.

In lieu of using boron for the ion implant channel stop, $BF_2^+$ may also be used which allows the use of the thin oxide (200 Å) and thin silicon nitride (1100 Å) layers. When using $BF_2^+$, a 35 KEV implant may be typically used which allows a more efficient use of the implanter.

Following implantation of the channel stops, as an option the wafer can be annealed at 1000° C. for thirty (30) minutes in $N_2$ to yield a V/I of 100 to 140 ohms in the groove bottoms. This step is not always necessary and is often done just on test wafers for comparison purposes.

The boron impurity formed into channel stop regions 23a, 23b, 23c is then driven into the substrate in a nitrogen-annealing step for 3 hours at a temperature of 1,000° C. followed by a 12-hour wet thermal oxidation cycle at 1000° C. and five minutes dry $O_2$ at 1000° C. to grow oxide in grooves 27a, 27b and 27c. A controlled push and pull of the wafers into the tube is used. Typically this oxide is grown to a thickness of approximately 17,500 Å. However, by using a thinner epitaxial layer and by utilizing vertical isolation, a thinner oxide (typically about 11,000 Å) in the grooves may be grown. A thinner oxide gives the added advantages of reducing processing times, reducing out diffusion of the buried layer into the epitaxial layer, improving metal coverage over field oxide, and reducing stress set up where the grown oxide butts up against the silicon islands. This stress occurs during the growth of the isolation oxide as it expands upward and outward against the silicon islands. The resulting structure including field oxide 14a, 14b, and 14c appears in cross-section in FIG. 2b. This field oxide is formed through thermal oxidation and the result is that a major portion of the boron impurity contained in P type regions 23a, 23b and 23c is consumed by the oxide 14 in accordance with the well-known redistribution effect due to the different segregation coefficients of boron in the underlying silicon 11 and the oxide 14. See, for an explanation of this phenomenon, A. S. Grove's book entitled "Physics and Technology of Semiconductor Devices" published by John Wiley and Sons, Inc. 1967, page 69, et al, and the papers on this phenomenon cited there on page 85. Because boron depletes from a region adjacent to thermally-grown oxide during the oxidation process (i.e., boron has a "negative segregation coefficient"), these channel stop regions must be overcompensated with boron so that when the thermal oxide is grown in the grooves, enough residual boron is left underneath the oxide to form an effective channel stop. Note that P type region 23b (FIG. 2a) is rendered to N type by the higher dopant concentration out-diffusing N+ buried layer 22 as-are-some portions of regions 23a and 23c (see FIG. 2b).

A word is in order here about the purpose of the annealing step prior to the growth of the thermal oxide in the isolation grooves. During isolation field oxidation, certain portions of the boron field implant dopant are lost in the oxide due to the redistribution of impurity as discussed above. To reduce the amount of field implant dopant lost during isolation field oxidation, the wafer is annealed as described above for up to three to four hours prior to field oxidation. This anneal step not only repairs the silicon lattice damage caused by the channel stop ion implant, thus preventing irreparable defects from occurring in this region during the growth of field oxidation, but also drives the implant deep enough into the silicon to prevent it from being consumed too much during the field oxidation. However, excessively long anneals can cause the boron field implant to diffuse too far laterally into the silicon islands which ruins vertical isolation and can short lateral PNP emitters to collectors.

At this point in the process, when used to make PROMS, a sink mask is sometimes formed on the wafer to define windows or openings to the sink regions 25b of the devices. Following the formation of the sink mask, the wafer is placed in a buffered HF etch for about sixty (60) seconds to remove thermally grown oxide on the nitride layer 26b. Nitride layer 26b is then removed by a 160° C. phosphoric acid etch for sixty (60) minutes followed by a well-known 10 to 1 HF dip (eight minutes) to remove oxide layer 24b (FIG. 2a) and clean the wafer. A PBr$_3$ predeposition is applied to the wafer by first placing the wafer in a nitrogen atmosphere with two percent (2%) oxygen for ten (10) minutes followed by ten minutes of PBr$_3$ from a 33° C. source, followed by 15 seconds of nitrogen with two percent oxygen at 900° C. One minute is taken for insertion of the wafer into the furnace and one minute for removal. The V/I for the sink region should be about 3.5 to 5.5 ohms.

There follows a 10 to 1 HF dip for ten seconds followed by a rinse and dry of the wafer. Then the wafer is oxidized for fifteen (15) minutes in dry oxygen, followed by ten (10) minutes in steam and five (5) minutes in dry oxygen. Twelve minutes are taken to push the wafer into the furnace and the same time is taken to remove the wafer from the furnace. The furnace is ramped from 880° C. to 1000° C. during this oxidation and the desired oxide thickness of 1500 Å. The V/I of the sink region should be 3.5 to 5.5 ohms.

Next, the nitride layer 26a (FIG. 2a) is stripped from the device by first using a buffered HF etch for fifteen (15) seconds to remove the oxide on the nitride layer and then using a 160° C. phosphoric acid etch for sixty (60) minutes to remove nitride layer 26a. The epitaxial thermal oxide 24a (400 Å thick) is left on the device. The base region beneath the remaining epitaxial oxide 24a is thermally oxidized at 1000° C. in ten (10) minutes dry O$_2$ and twenty (20) minutes steam to a thickness of about 2,200 Å using standard processing to yield the oxide 24h overlying the sink region 25b and the active device region 25a on the structure shown in FIG. 2b.

It is often desired to include an additional 1,000° C. 30-minute dry oxygen or N$_2$ cycle at the end of the base wet oxidation cycle. This step aids in reducing the negative segregation coefficient of boron depletion from silicon. The optimum time for the oxygen or nitrogen cycle (and nitrogen is preferred) is selected so that the boron impurity is not driven so deeply into the epitaxial layer or substrate as to lose vertical isolation but long enough to maximize the boron concentration next to the oxide layer. This high temperature nitrogen cycle results in improved collector to collector electrical isolation.

The third mask, called the base exclusion mask or "base mask", is now applied to the device. This base exclusion mask (typically a photoresist layer 29) is applied to exclude from certain areas (the N type base of a to-be-formed lateral PNP transistor, the N type collector sink, and any high value resistors to be formed in the structure) the p-type impurity to be implanted in the N-type epitaxial layer 25 to form certain PNP emitter and collector regions to be described shortly. The implant also forms the active and inactive base regions of the NPN transistor. Typically, this mask is used to configure photoresist layer 29 so as to retain portions of the photoresist over the N type base region of the to-be-formed PNP lateral transistor, the collector sink and the high value resistors, thereby preventing P type ions from being implanted into these regions. In addition, a Schottky region can be formed by the base exclusion mask.

Following the patterning of this photoresist 29a, 29b (FIG. 2b) to form the base exclusion mask, a P type impurity such as boron is implanted into the top surface of the device through the thin oxide layer 24h over the top surface of the device. Oxide 24h not only serves as a subsequent masking media but also assists in preventing unwanted damage to the silicon in which the impurity is being implanted. However, the implant dose is sufficiently low to prevent serious damage to this silicon even without oxide 24h. Photoresist 29a and 29b and thick field oxide 14a, 14b and 14c prevent boron from reaching the underlying portions of the semiconductor material. However, boron ions penetrate oxide 24h to reach the top surface of islands 25a and 25b and form P type emitter and collector regions 25c and 25d, respectively, of the to-be-formed lateral PNP transistor, form portions of the P type base region 25d of any to-be-formed vertical NPN transistor, and P type base resistors. Typical doses for formation of boron regions 25c and 25d are $7 \times 10^{+13}$ ions/cm$^2$ with an implantation energy of 117 KEV.

Next, photoresist 29a and 29b is stripped from the device. This is followed by the formation of an NPN emitter mask (the fourth mask to be used in wafer fabrication or, if the sink option described above was employed, the fifth mask). This mask defines the emitters 25e and 25f (FIG. 2c) formed in P region 25d of the NPN vertical transistor and the buried layer contact region 25g to the buried layer 22 and collector 25a of the NPN vertical transistor.

Figure 2B:
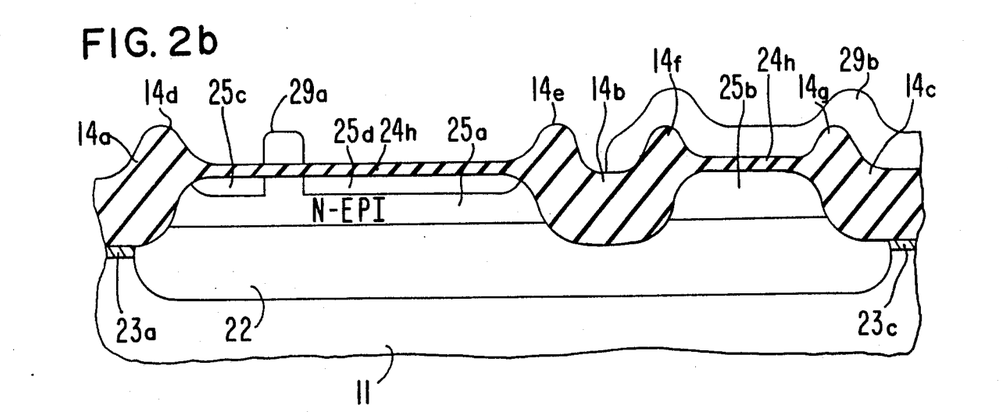
FIGS. 2b and 2c illustrate the structure shown in cross-section in FIG. 2d during intermediate stages of its manufacture.
Figure 2C:
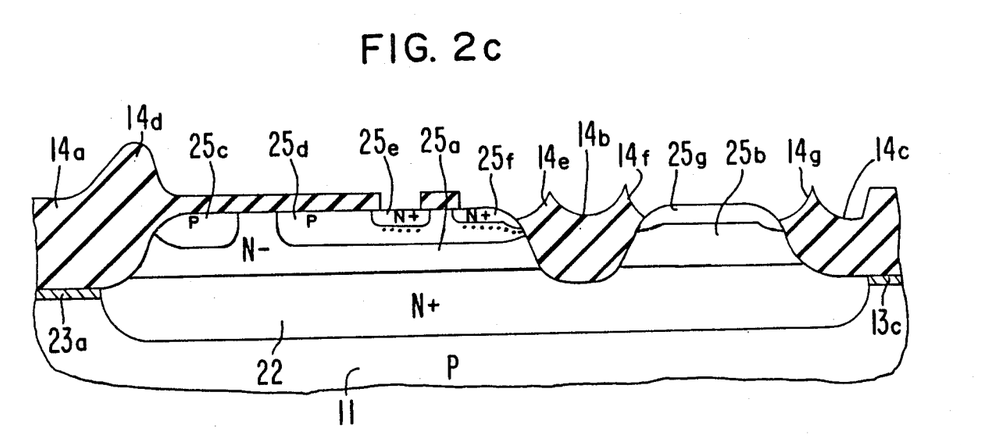
Figure 2D:
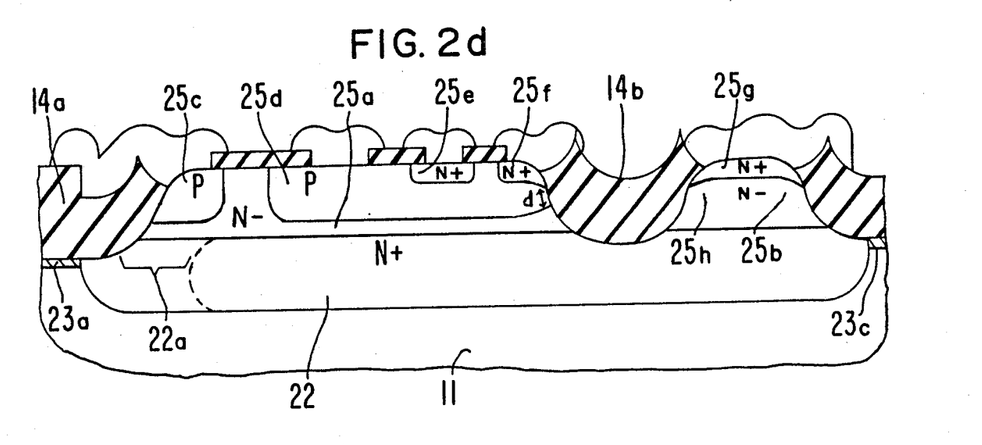
FIG. 2d illustrates in cross-section a portion of the structure of another embodiment of this invention; and, FIG. 3 illustrates graphically the impurity distribution across the emitter, base and collector of the structure shown, for example, in cross-section in FIG. 2d.

Next, the isolation oxide formed in region 14b is etched back using a buffered HF etch for four (4) minutes to remove parts of portions 14e and 14f thereof (see and compare FIGS. 2b and 2c which illustrate this step schematically). When etching back the isolation oxide formed in region 14b as described above, which is done simultaneously while etching the NPN emitter openings in oxide 25h at emitter mask, an over-etch of approximately 2,000 Å is done so that approximately 4,000 Å of oxide is removed over a portion of the field oxide regions adjacent the to-be-formed emitter regions. This creates a 4,000 Å step. This step is small enough to cause no problem of step coverage by the metal to be used to contact certain active regions of the device. However, in carrying out this etch, there is a risk that the etch will remove the field oxide portions 14e and 14f too far down the silicon islands 25a, 25b sidewall, thereby exposing portions of these sidewalls to the N type emitter diffusion which causes the N type emitter region 25f to be formed closer to the N+ buried layer 22 than desired. I$_{CEO}$ implant of boron ($7.0 \times 10^{+12}$/cm$^2$ at 150 KEV) is designed to provide a selected boron impurity concentration in the active P region 25d just beneath and along the oxide sidewalls of silicon islands 25a and 25b next to emitter 25f to prevent I$_{CEO}$ leakage (that is, leakage between the collector and the emitter of the device with the base open) of all NPN transistors in the circuit (including the peripheral circuits of the RAM or PROM arrays). The peak concentration of the I$_{CEO}$ implant is shown by the dotted line in FIG. 2c and FIG. 4a. In addition, the I$_{CEO}$ implant serves as a portion of the active base 25d of the NPN vertical transistor. FIG. 2d shows the shape of the base region 25 after the I$_{CEO}$ implant which serves to increase the separation between the emitter and the collector in the region adjacent to the oxide sidewall as shown by the arrow d. If the option of "soft" sinks is used, to keep the $I_{CEO}$ implant out of the sink regions (25g, 25h) an extra mask must be inserted at this point to cover up the sinks. This mask comprises a photoresist. This mask would normally be used at sink or at the third masking step if a hard sink (i.e., a sink containing additional N type impurity) were used. In essence, in going from a hard sink to a soft sink, the masking step normally done as the third step is now inserted between the fifth and sixth masking steps.

In addition, an implant of boron ($1 \times 10^{14}/cm^2$ at 70 KEV) is used at this point in the process if PROMS are being made, to increase $LV_{CEO}$ of the vertical NPN transistors in the array (to be discussed later in conjunction with FIG. 4a). This implant lowers the beta and thus raises $LV_{CEO}$ of the vertical transistors in the memory array thereby increasing the programming yield of this array. This implant is not made in the peripheral devices which, therefore, must be masked.

Next, photoresist is stripped and the wafer is annealed at 1000° C. for thirty (30) minutes in nitrogen with two (2) percent oxygen. Next the wafer is cleaned (fifteen seconds in 10 to 1 HF) and an emitter predeposition using phosphorous (preferably PBr$_3$ at 960° C. for six (6) minutes) provides N+ regions 25e and 25f for the emitters of the NPN vertical transistor. Simultaneously, an N+ sink diffused region 25g is formed over the top of island 25b (See FIG. 2c). This is followed by a 100 to 1 HF dip for fifteen seconds to clean the wafer, and the wafer, is then rinsed and dried.

The fifth mask comprises the contact mask for the PNP emitter and collector and the NPN base, Schottky contact and base resistors. The base 25d of the vertical NPN transistor containing multiple emitters 25e and 25f also serves as the collector of the lateral PNP transistor and thus the PNP collector and the NPN base contact comprise the same contact structure as is apparent from FIG. 2d. The PNP base contact is made through the collector sink 25g, 25h in silicon island 25b, buried layer 22 to the N type region 25a which serves as the collector of the NPN vertical transistor and as the base pickup of the PNP lateral transistor. The "soft" sink means that the N+ impurity in region 25g extends into only a portion of region 25b, leaving the N epitaxial material of region 25h substantially unaltered. This soft sink provides about 100-200 ohms vertical resistance in the circuit. A "hard" sink comprises N+ impurity extending through region 25h to buried collector contact 22. Contact is made to regions 25c and 25d by forming photoresist on the surface of the structure to leave exposed the regions of oxide 24h to be removed to expose the contact areas on these regions. Oxide 24h is removed by submerging the wafer in a buffered HF etch for four (4) minutes.

The remainder of the processing is standard, requiring formation of the contact openings to the various regions of the device and the formation of the contacts, interconnecting lead structures and dielectric isolation. Thus, these steps will not be described in detail.

The features of the above-described process include the fact that the PNP emitter and collector regions 25c and 25d and the NPN collector and PNP base contact are self-aligning in the sense that at least three of the four sides of these regions are defined by the field oxides 14a, 14b, and 14c (FIGS. 2a through 2d). Although FIGS. 2a through 2d illustrate the structure of this invention in cross-section, it should be realized that the top view of this structure would show the field oxide defining the lateral dimensions of islands 25a and 25b. The lateral dimension of the PNP base (the remainder of the N epitaxial layer 25a shown in FIGS. 2b to 2d) parallel to the plane of the drawings of FIGS. 2a through 2d is approximately 2.5 microns. The lateral dimension of the PNP base perpendicular to the plane of the drawings of FIGS. 2a through 2d is reduced by the lateral growth of the oxide 14 during the formation of field oxide. This base dimension is defined by the base exclusion mask (the third mask).

The sink formed in region 25b can be "soft"; that is, no sink diffusion or ion implantation takes place in the sink region.

Care must be exercised along the sidewall of the oxide isolation 14a, 14b and 14c due to phosphorous pile-up. A somewhat heavier $I_{CEO}$ implant may be needed to prevent sidewall channels from forming between the buried layer 22 and the N type emitter 25f (FIG. 2c) for example. However, higher implanted doses will suppress the beta of the NPN vertical transistor comprising regions 22, 25a, 25e and 25f.

The rather low PNP emitter and collector dopant concentrations (about $2 \times 10^{+18}/cm^3$) cause a low PNP beta due to poor emitter efficiency. Typical betas for this structure have been found to be 0.2 to 0.8. For a completely oxide walled structure, betas of 1 to 2 have been noted. The PNP transistor serves only as a load and thus these low betas are acceptable. As an important added advantage, the poor PNP emitter efficiency substantially reduces minority carrier injection into the substrate, thus improving circuit efficiency. Since the PNP emitter (formed by the single base boron implant) is of relatively low concentration, the emitter injection efficiency of the PNP into the substrate is very low, compared to a PNP emitter formed by a high dopant concentration plug. This substantially reduces electron injection into the substrate thus alleviating the RAM or PROM $\phi$ stack floating problem ($\phi$ is the voltage drop across a forward biased PN junction). The $\phi$ stack floating problem refers to the increase in the reference voltage levels measured at each PN junction of a number of diodes connected in series as a result of ground loop currents increasing the voltage of the ground as seen by each junction (i.e., the $\phi$ stack problem changes the voltage of ground).

The above-described process produces a structure compatible with the "vertical fuse" programming profile used to form PROMs by avalanching and therefore destroying selected emitter-base junctions.

Figure 3:
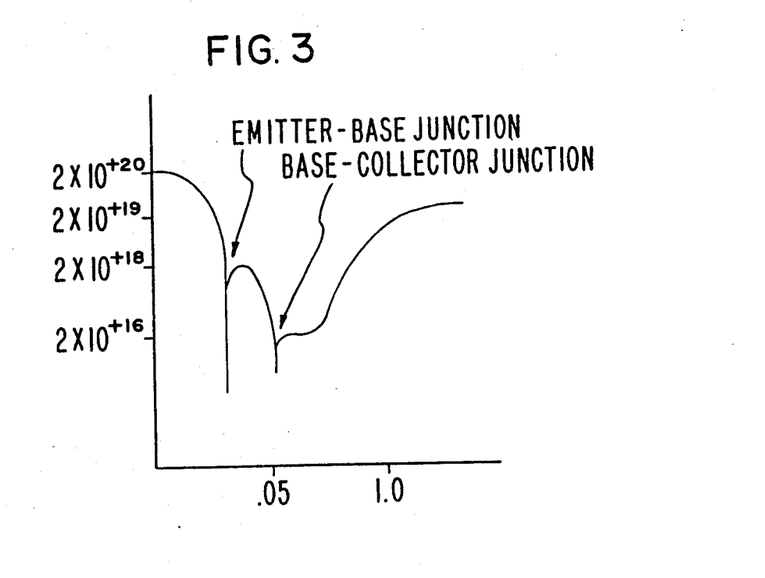

In one embodiment, arsenic is used as the implant dopant to form the emitters 25e and 25f (a dosage of $1 \times 10^{16}$ ions/cm$^2$ at 60 KEV is preferred). This implant is preferably made through a 250 Å thick thermal oxide layer which is regrown after forming the emitter windows. Both the base and emitter implants are driven in together. The base implant must be of much higher dosage (typically around $5 \times 10^{14}$ to $10^{15}$ ions/cm$^2$). The arsenic dopant is just slightly shallower so as to leave only the steep leading edge of the dopant profile of the base implant in front of the emitter. The relative concentrations as a function of depth of the emitter-base and base-collector junctions in the device are shown in FIG. 3. The peak concentration of the emitter is $2 \times 10^{20}/cm^3$ while the peak concentration of the base is about $2 \times 10^{18}/cm^3$. The result is a very fast NPN transistor with a very shallow, high-gradient base profile. Any channelling along the sidewall of island 25b will be eliminated with the added concentration of P type impurity along the sidewall due to the $I_{CEO}$ implant. The emitter etch is typically 4 minutes or less to prevent the emitter from poking out in front of the base along the sidewall by removal of the field oxide 14b, 14c down to and below the base 25d.

While the above process does allow the formation of an in line sink but does not allow the formation of sidewall resistors as disclosed in Alter, U.S. Pat. No 4,149,177 and Berry, U.S. Pat. No. 4,118,728, the structure is particularly suitable for use in the manufacture of fast RAMs and programmable PROMs capable of high manufacture yields. Although the device is emitter etch sensitive, the process does offer a greater simplicity compared to one current standard oxide isolation process.

Because the diffused field predeposition is replaced with an ion implant, and nitride is used as a shadow mask to prevent the sidewall from being doped, vertical isolation is achieved whereby certain active regions of devices are separated from the under lying channel stop regions. Thus, the packing density of the device is improved. The rather shallow base implant for region 25d and the relatively high phosphorous pile-up along the intersection between the isolation oxide and the sidewalls 28a, 28b, 28c and 28d of silicon islands 25a, 25b thus achieves isolation by turning to advantage what previously was considered a disadvantage of oxide isolation techniques (the pile-up of phosphorous impurities in front of thermally grown oxide). In addition, the lateral PNP transistor as represented by emitter 25c and collector 25d with epitaxial material 15a (FIG. 1) or 25a (FIG. 2) serving as the base, replaces the previous non-active load resistor used in the circuit.

Figure 4A:
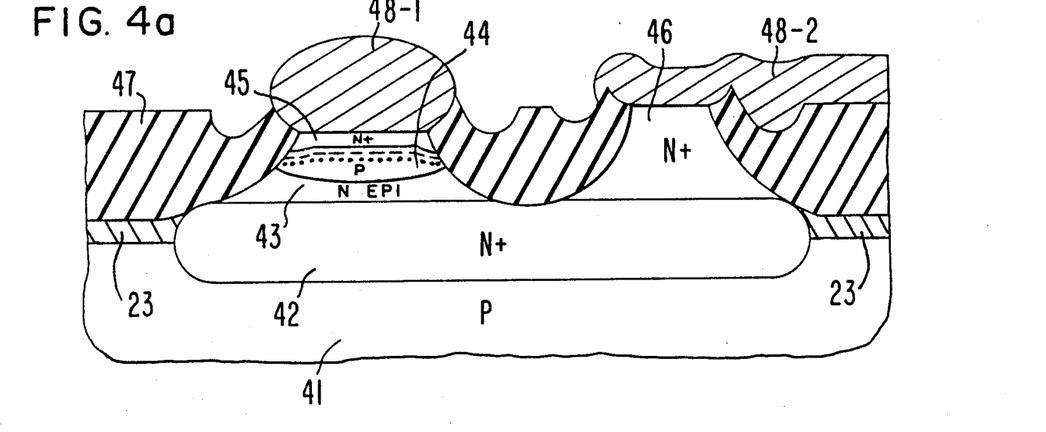
FIG. 4a illustrates in cross-section a PROM cell constructed in accordance with this invention.

A PROM cell constructed in accordance with this invention is shown in FIG. 4a. In FIG. 4a, P type substrate 41 has formed in it N+ buried layer 42. Formed over the top surface of substrate 41 is an epitaxial layer with N type impurity concentration. From this N epitaxial layer, in a manner described above, has been formed an epitaxial region 43 comprising part of the collector of the device, a floating P type base region 44 and an N+ emitter region 45. Collector sink 46 is shown as a hard collector sink. In some situations sink 46 can be a soft collector sink depending upon the requirements of the memory cell. The advantage of the structure shown in FIG. 4a is that only a collector contact and an emitter contact need be formed to the device thereby reducing the cell size by eliminating the base contact area. The structure shown in FIG. 4a is formed in the manner described above in conjunction with the structures in FIGS. 2a through 2d with appropriate modifications to reflect the absence of the lateral transistor. P+ channel stop regions 23 underlie portions of field oxide 47.

The process is suitable for use to form programmable read-only memories because the elimination of the field predeposition increases the NPN base-collector breakdown voltage of the structure. Prior art oxide isolated structures have a breakdown voltage of about 16 volts. By eliminating the diffusion in the sidewalls, the breakdown voltage from collector to base with emitter open ($BV_{CBO}$) is raised to 23 to 27 volts. This allows the structure to sustain the voltage necessary to destroy the base-emitter junction (between emitter 45 and base 44 in FIG. 4a) because the current necessary to destroy the base-emitter junction depends upon the size of the emitter. By controlling the lateral dimensions of the semiconductor material comprising pocket 43, for example, and similar pockets, the emitter size can be controlled to an accuracy of $\pm\frac{1}{2}\mu$ by controlling the isolation oxide size. The emitter 45 is walled on four sides in the PROM memory cell application (no base contact is needed to the device because the base is allowed to float in this embodiment) and, therefore, when oxide encroachment is taken into account, a 6×6 micron silicon island 43 becomes, in the active device, about $2\frac{1}{2} \times 2\frac{1}{2}$ microns in size. This reduction in size substantially increases the packing density achieved using the process of this invention and by decreasing chip size increases yield. By ensuring that $BV_{CBO}$ is roughly 23 to 27 volts, the current sufficient to destroy the emitter-base junction can be generated in the structure. For a given value of beta and with higher $BV_{CBO}$, a higher $LV_{CEO}$ will result in accordance with the relation:

$$LV_{CEO} = BV_{CBO}/n \sqrt{\text{beta}}$$

where n=3 to 4 for silicon. In order to enhance $LV_{CEO}$, an extra mask and implant is utilized only in the memory cell to depress beta, thus raising $LV_{CEO}$. This aids in increasing programming yields for PROMs. The dashed line in FIG. 4a shows the location of the peak concentration of the $LV_{CEO}$ implant.

Use of <100> crystallographic silicon material is preferred because it eliminates what is called "epi shift", gives an isotropic "bird beak" and, therefore, allows better metal coverage and yields devices with better $I_{CEO}$ characteristics.

The vertical isolation is achieved by the use of N epitaxial material (1.5 to 3 ohms-cm) with no field predeposition along the sidewall. The P type base 25d formed in the N epitaxial layer is not allowed to reach the underlying P type $1\frac{1}{2}$ to 3 ohm-cm substrate, thus preventing leakage from the P type base to the P type substrate. For these epitaxial layer and substrate dopant concentrations, the substrate will not diffuse upward into the epitaxial layer since both dopant concentrations are approximately equal, i.e. about $1 \times 10^{+16}/cm^3$. However, a lower resistivity substrate (typically 0.4–0.6 ohm-cm) allows the P type impurity to diffuse upward into the epitaxial layer (about 0.6–0.7$\mu$ for 0.4–0.6 ohm-cm substrate) since the substrate dopant concentration now exceeds that of the epitaxial layer. When using a 1.5 micron thick epitaxial layer, this upward diffusion is sufficient to contact the lower portion of the base, thus ruining vertical isolation.

The lateral PNP base (FIG. 2d) is reverse biased with respect to the substrate; therefore, parasitic hole injection occurs which is picked up in the substrate. This charge must be eliminated to prevent interference with the $\phi$ stack which is referenced above the substrate. Otherwise, the product made using this structure may suffer from "floating" $\phi$ stacks at high current injection and thus become unstable. Either a gold alloy through the back side of the wafer for contact or contact to the substrate via a ground tap P type implanted sinker from the top surface achieves this. The latter case requires an additional masking step.

In accordance with this invention, an active PNP cell can be made using one masking step. Using the process of this invention, epitaxial resistors are well-controlled because they are implanted. However, as epitaxial resistors become narrow, a problem can occur with critical dimensions. While the process makes a very good 6-micron wide resistor (which with oxide encroachment will reduce down to 2 microns wide) by using the latest state of the art photolithographic techniques, this resistor can be fabricated down to 1 micron wide after oxide encroachment.

The soft sink uses N epitaxial material as the sink. Because there is no field predeposition of impurities along the sidewalls of this sink, the soft sink can be made smaller by approximately 2 microns per dimension than prior art sinks because it will not be pinched off by the encroachment of the field predeposition impurities during oxidation.

FIG. 2d illustrates in dashed line an optional embodiment wherein buried layer 22 terminating prior to contact with the left most field oxide 14a. The space 22a represents a PN junction between the P type substrate 11 and the N type epitaxial layer 25. During operation, P type region 25c is forward-biased relative to N type epitaxial layer portion 25a and thus the P type substrate 11 in combination with N type region 25a and P type region 25c acts as a transistor with possible substantial gain. To avoid this, buried layer 22 can, if desired, and indeed should in some applications, extend all the way into contact with the field isolation oxide 14a, as shown. Thus, buried layer 22 would contact and overwhelm a portion of P plus region 23a as shown in FIG. 2d. Alternatively, in certain circuits, it is advantageous to have a substrate PNP device capable of producing substantial current. Should that be the case, buried layer 22 can be terminated at the dashed line as shown in FIG. 2d.

In the PROM process, the yield in die per wafer has increased an average of about one order of magnitude as a result of use of this process.

Figure 4B:
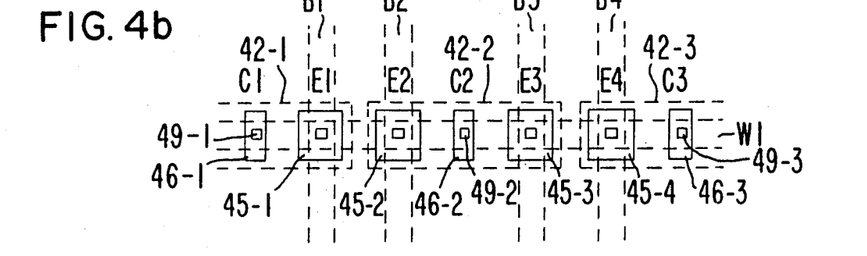

FIG. 4b shows the structure of FIG. 4a in top view with, however, a modification wherein each collector sink 46, 46-1, 46-2 and 46-3 (FIGS. 4a and 4b) is used to provide electrical contact to two active devices rather than one active device. Thus, for example, collector sink C2 (46-2) makes electrical contact to the active devices including emitters E2 and E3 (numbered 45-2 and 45-3 in FIG. 4b). Buried layer 42-2 allows electrical contact from collector sink 46-2 to the two devices containing emitters E2 and E3 underneath the isolation oxide 47 surrounding each of these two active devices. Oxide 47 defines the lateral extent of these devices.

Bit lines B1, B2, B3 and B4 are shown running vertically in the drawing. Bit lines B1 to B4 are formed on insulation over the surface of the device. Each bit line is electrically connected to those emitters underlying it through oxide cut contacts. For simplicity, these contacts are not shown in FIG. 4b. The bit lines B1 to B4 comprise the first conducting layer on the structure. A second layer of insulation is then placed over bit lines B1 to B4 (which typically are fabricated from metal but could also be fabricated of other conductive material such as selectively doped polycrystalline silicon). On top of the second layer of insulation (typically a phosphorus doped silicon dioxide or silicon dioxide-silicon nitride composite layer) is formed a series of horizontal word lines. Word line W1 is shown in FIG. 4b extending horizontally across the paper. Each word line contacts those collector regions underlying it through vias such as vias 49-1 through 49-3 as shown in FIG. 4b.

The advantage of the structure shown in FIG. 4b is that one collector sink serves two active devices, thereby eliminating half the collector sinks normally used in a PROM. Consequently, device packing density is improved. In another embodiment shown in FIG. 4e, each sink (such as C1) contacts four active devices (such as E1, E2, E3 and E4), two on each side of the sink, thereby further improving packing density. In general, up to N active devices can be contacted by each sink, where N is a selected positive integer limited by the voltage drop acceptable in the circuit.

Figure 4C:
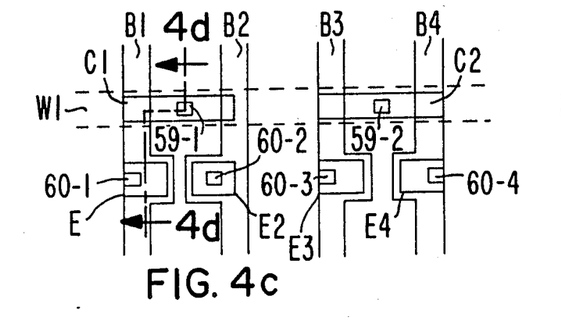

Another embodiment of this invention similarly improving packing density by using one collector sink to contact two or more active devices is illustrated in FIG. 4c. Here the collector sink regions C1, C2 corresponding to region 46 in FIG. 4a are shown arranged horizontally across the top portion of the drawing. Word line W1 extends horizontally across the structure electrically contacting the underlying sink regions through vias 59-1, 59-2.

The devices containing emitter regions E1 and E2 are electrically connected to the corresponding collector sink region C1 by a buried layer 42 (shown in isometric cut-away view in FIG. 4d) underneath the isolation oxide 47 separating the emitter regions from the collector sink regions. Emitter regions E3 and E4 are electrically connected to collector sink region C2 by a buried contact layer similar to layer 42 shown in FIG. 4d. Bit lines B1 to B4 are formed on insulation overlying the top surface of the structure and make contact to underlying emitter regions E1 to E4 through oxide cut contacts 60-1 through 60-4 formed through this insulation. Word line W1 is formed on insulation overlying bit lines B1 to B4.

An advantage of this invention is that the oxide cut contacts 60-1 to 60-4 can each overlie a portion of the field oxide 47 so long as a portion of each contact exposes the underlying emitter region. This allows a greater tolerance on the separation of the bit lines B1, B2, B3 and B4 than would otherwise be expected for a structure with as large a packing density as achieved with this structure. Each bit line contacts a plurality of underlying emitter regions associated with other cells in a manner such as described above for emitters E1 to E4 in FIG. 4b.

Overlying the top surface of the structure including bit lines B1 to B4 is a second layer of insulation (typically a phosphorus doped silicon dioxide or a composite layer of silicon oxide and silicon nitride) and on this second layer of insulation are formed the horizontal word lines for the memory of which word line W1 is shown in FIG. 4c. Word line W1 contacts a plurality of underlying collector sinks shown as C1 and C2 in FIG. 4c through vias such as vias 59-1 and 59-2 as shown in FIG. 4c. Each word line contacts the plurality of collector sinks formed beneath the word line through vias such as shown in FIG. 4c.

Figure 4D:
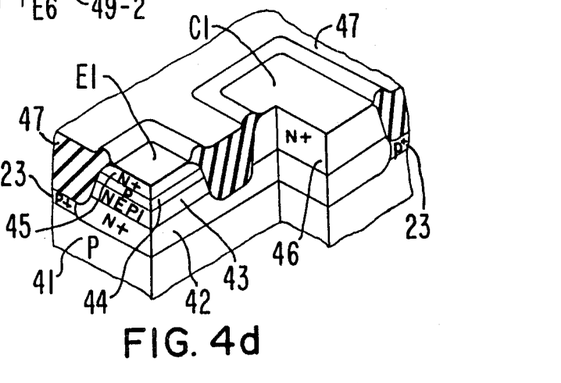
FIG. 4d is an isometric cutaway view of a portion of the structure shown in FIG. 4c.
Figure 4E:
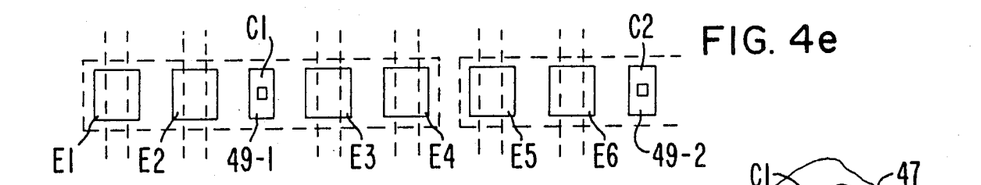
FIG. 4e shows a top view of an embodiment similar to that of FIG. 4b.

FIG. 4d shows an isometric cut-away view of a portion of the structure shown in FIG. 4c along section 4d. FIG. 4d shows the relationship of a P-type silicon substrate 41 to the other regions formed in the substrate. N+ buried layer 42 extends underneath emitter E1 and collector sink C1 as shown and similarly under emitter E2 (not shown). Field oxide 47 defines the lateral extent of emitter E1 and collector sink C1 on all sides. P+ channel stop regions are denoted by 23. Buried contact layer 42 extends underneath field oxide 47 to connect electrically emitter E1 to collector sink C1. Collector sink C1 is a hard sink having been converted to N+ conductivity type from its normal N conductivity type. N epitaxial layer 43 has formed in it P type base region 44 to which no contact is formed and N+ emitter region 45 to which electrical contact is formed from the top surface of the structure as shown in top view in FIG. 4c. FIG. 4d illustrates clearly the fact that the lateral extents of the collector sink and the emitter regions are defined by the oxide region 47 and shows the important size reductions achievable by eliminating the base contact in the PROM cell. In programming the device, the PN junction between base region 44 and emitter region 45 is selectively avalanched to break down this junction in selected transistors in the PROM (which contains a plurality of cells of the type shown in FIG. 4a) thereby to form a short circuit. The way in which this is done will be briefly described below.

Figure 4F:
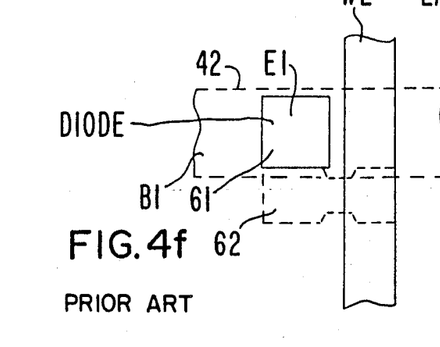
FIGS. 4f and 4g illustrate the reduction in device size achievable using the structure of this invention.

FIGS. 4f and 4g show the size reduction achievable by using the structure of this invention as compared to certain prior art NICHROME (Registered Trademark) (nickel-chromium) structures. As shown in FIG. 4f, the emitter region 61 is reasonably large and is attached to one end of a fuse link 62, the other end of which is attached to a bit line such as line B1. As an alternative, the emitter region 61 can be substituted by a base-collector diode or a Schottky. Typically bit line B1 is formed of a metal such as aluminum. In programming the cell, the fuse link 62 will either be left intact thereby leaving a short circuit, or blown, thereby creating an open circuit. The fuse linked together with the emitter region takes surface space and reduces packing density.

Figure 4G:
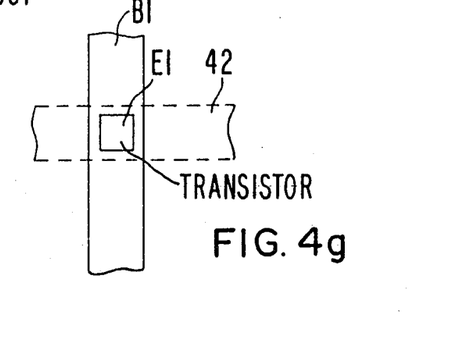

FIG. 4g illustrates the compact structure of this invention wherein the bit line B1 is directly contacted to the underlying transistor emitter E1 through a contact cut. The bit line again is formed of a metal such as aluminum and the buried layer 42 provides electrical contact to the emitter region E1 from a collector sink (not shown for simplicity). A comparison between prior art (FIG. 4f) and the vertical fuse structure (FIG. 4g) illustrates the substantial savings in space for this invention.

Figure 4H:
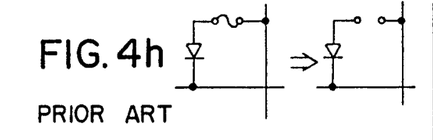
FIGS. 4h and 4i are circuit schematics of the structure of FIGS. 4f and 4g, respectively, before and after programming.
Figure 4I:
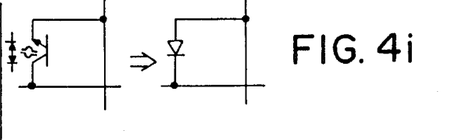

FIGS. 4h and 4i illustrate the circuits resulting from programming the structures of FIGS. 4f and 4g, respectively.

Figure 5A:
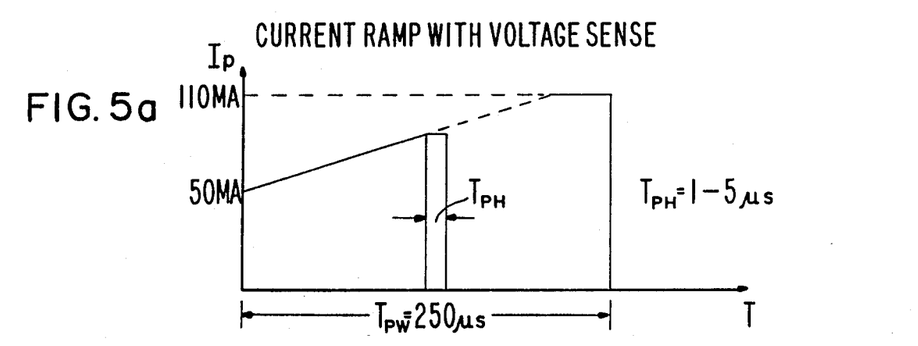
FIGS. 5a through 5f illustrate the technique used to program the PROM cells of this invention.

The programming procedure for programming the PROM cell of this invention is illustrated in FIGS. 5a through 5f. In FIG. 5a, the programming current as a function of time is illustrated for use with the "vertical fuse" (i.e. short-circuited or "blown") emitter structure shown, for example, in FIGS. 4a through 4d. The optimum programming process is one which is insensitive to design and process variations on the product and which delivers the optimum amount of power to the cell to be programmed. At the same time, the programming structure and method must be sensitive to the avalanching of the emitter-base junction so as to minimize damage to the base-collector junction of the device being programmed. Accordingly, the current source used to deliver the programming power must reduce power after the avalanching of the junction and must automatically shut off power after the cell has been "programmed" (i.e., the emitter-base junction destroyed) with a selected delay time. If during programming the base collector junction of a cell is damaged, then leakage may occur through that cell when another cell is being read. Typically the leakage path goes from the bit line attached to the selected cell through to the word line attached to a non-selected or "de-selected" cell, through the damaged base collector junction of this de-selected cell to the bit line attached to this de-selected cell and then through another cell attached to the word line connected to the selected cell. Naturally, this leakage is undesirable. A similar leakage path is generated by an abnormally low $LV_{CEO}$ in a de-selected cell. Again, this leakage path is undesirable (this leakage can prevent proper programming of the PROM) and thus proper device processing to prevent low $LV_{CEO}$ in a cell is essential to avoid the identical type of leakage to that caused by a damaged base-collector junction.

In selecting the programming technique, the advisability of using constant current pulses of selected width was considered. Unfortunately, a constant width pulse sometimes results in base-collector junction damage of certain cells because the current required to program a cell is a function of the cell parameters such as emitter-base junction area and cell characteristics. Accordingly, it was discovered that a constant current pulse of a selected width gave poorer programming yields than desired. It was concluded that each cell needs different programming voltage because of the expected variations in cell parameters. Thus, using a constant current source pulse of selected width requires frequent adjustments of the width of the current source pulse and its amplitude.

A variable width constant current cell wherein the pulse width was adjusted according to the requirements of each cell yielded good base-collector junctions. However, if the base-emitter junction was destroyed at the rising edge of the pulse the detection of the blowing of this junction is difficult. Moreover, the programming current required was dependent on design and process variations. Accordingly, it was decided to program each cell with a current source ramping up in time. The duration of the ramping current pulse was variable, dependent upon when the emitter-base junction blew out. The ramping current source made possible easy detection of the blowing of this junction. The programming current using this technique is self-adjusting to the needs of each cell. The result is a high programming yield and high reliability of both the programming method and the resulting programmed memory.

Figure 5B:
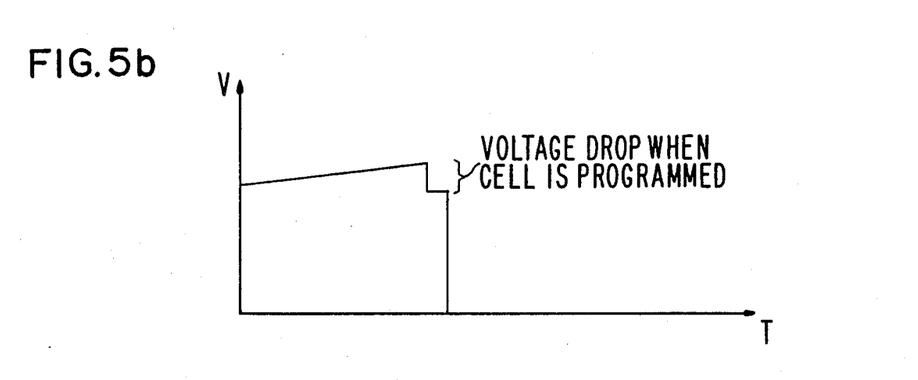

A current ramp used in conjunction with a voltage sense circuit (of well-known design and thus not described) is illustrated in FIGS. 5a and 5b. As shown in FIG. 5a, the current ramps up for a selected time until a drop in voltage is noted across the cell. A voltage sense circuit detects this drop in voltage across the cell and maintains the current from the current source for a small additional time $T_{ph}$ which varies from 1 to 5 microseconds and then shuts off the current source. The maintenance of the current for this additional time $T_{ph}$ ensures a low resistance programmed cell and at the same time optimizes the power devoted to each cell, thus minimizing the likelihood that the base-collector junction of the programmed cell will be damaged. This minimizes the possible occurrence of leakage through the programmed cell when this cell is a de-selected cell connected in the manner described above.

Figure 5C:
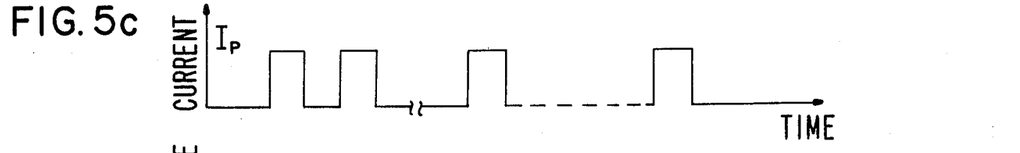
Figure 5D:
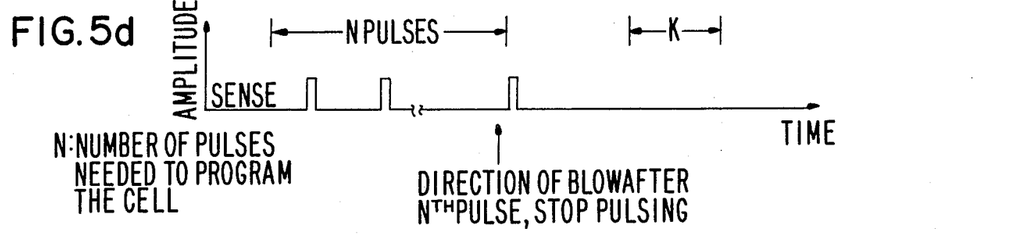

Another useful technique for programming each cell also uses a series of current pulses as illustrated in FIG. 5c. The current pulses are generated until a given cell is programmed. The total current through the cell is a function of the cell parameters. Following the detection of the blowing of the emitter-base by the application of a sequence of sense pulses wherein one sense pulse occurs following each current pulse, additional K current pulses are provided to ensure low resistance in the programmed cell but not for such a period of time as to damage the base-collector junction. The number of pulses needed to program each cell varies depending upon the characteristics of each cell.

Figure 5E:
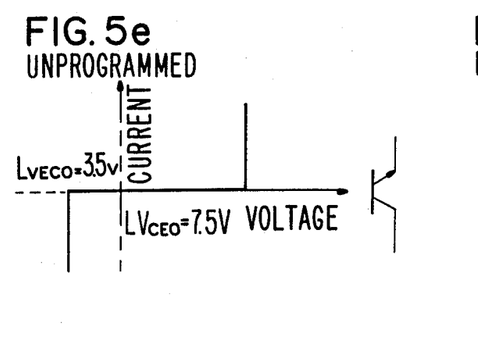
Figure 5F:
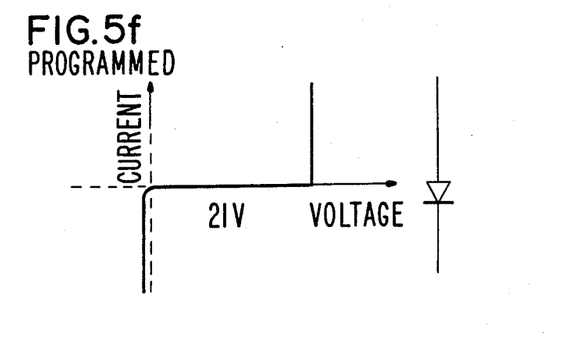

FIGS. 5e and 5f illustrate the memory cell electrical characteristics in the unprogrammed and programmed state, respectively. As noted in FIG. 5e, the $LV_{CEO}$ of the cell is about 7.5 volts when the cell is not programmed. When the emitter-base junction is destroyed, the back voltage across the diode becomes about 21 volts or greater, corresponding to the voltage breakdown across a collector-base junction using recessed oxide of the type described above in conjunction with FIGS. 2a–2d. On the other hand, the forward bias voltage across the junction is merely about 0.6 to 0.7 volts and the unprogrammed reverse-biased voltage from emitter to collector with the base open is about 3.5 volts as illustrated in FIG. 5e.

Figure 5G:
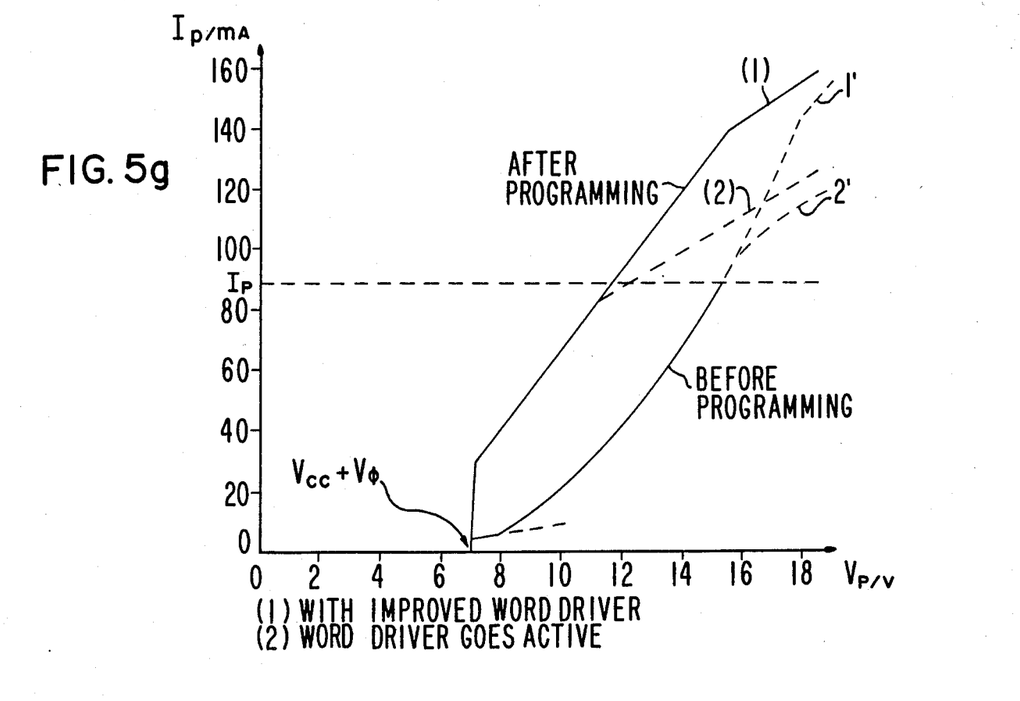
FIG. 5g illustrate the programming path I-V curve.

FIG. 5g illustrates the programming path I-V curve. As shown in FIG. 5g, the current voltage path before programming compared to the current voltage path after programming exhibits hysteresis such that after programming the I-V path is displaced substantially to the left on the curve. The programming curve Ip is that current at which the cell programs. Once the cell has been programmed, the voltage across the cell drops drastically from about 9 volts as illustrated in FIG. 5g to about 15 volts. This plot illustrates the importance of ensuring that $LV_{CEO}$ be greater than 9 volts and, as described above, preferably in excess of 12–15 volts to ensure adequate tolerance for the programming of each cell in the array without exceeding $LV_{CEO}$.

Among the advantages of the above-described process compared to the prior art processes, is the elimination of the boron tube and the low temperature oxidation cycle, the omission of the base drive step and the elimination of certain mask making steps. In addition, a field implant is used instead of a field predeposition followed by low temperature oxidation. The additional process steps include an $I_{CEO}$ implant to prevent collector to emitter leakage, and, when PROMS are being made, an additional implant to improve $LV_{CEO}$.

In the manufacture of the structure of this invention, an additional advantage is obtained by removing those portions of silicon nitride and silicon oxide layers 24a and 26a (FIG. 2a) in such a manner that the silicon dioxide layer 24a is removed as shown in FIG. 2a underneath the lateral extremities of silicon nitride layer 26a. This is done by etching away prior to silicon etch portions of the silicon dioxide layer 24a underneath the lateral extremities of the silicon nitride layer after having patterned silicon nitride layer 26a to expose the regions of epitaxial silicon 25 to be removed to form grooves 27a, 27b and 27c. A buffered HF etchant (buffered with ammonium fluoride) is used for this and the wafer is placed in this etchant for times varying from one to eight minutes. Then portions of the epitaxial layer 25 exposed by removal of the silicon dioxide and silicon nitride are etched using a standard silicon etchant (such as an iodine buffered mixture of acetic, nitric and HF acids) to leave a plurality of islands of semiconductor material. The epitaxial silicon is removed laterally beneath the overhangs of the silicon nitride thereby to form sidewalls on the silicon islands recessed beneath the overhangs of the nitride layer 26a by the amount of the removed silicon dioxide. Surprisingly, the sidewall angle is substantially the same (about 57°) as when the silicon is etched without removal of substantial silicon dioxide. Then the channel stop regions are formed in the bottoms of the grooves 27a, 27b and 27c, laterally displaced from the silicon islands an additional amount determined by the overhang of the silicon nitride layer 26a over the silicon dioxide layer 24a, thereby to prevent the channel stop regions from laterally diffusing to the silicon islands during subsequent processing of the wafer.

While embodiments of this invention have been described, these descriptions are meant to be illustrative only and are not intended to limit the scope of the invention. Other embodiments of this invention will be obvious to those skilled in the art.

What we claim is:

1. The method of forming a semiconductor device comprising:

forming in a semiconductor substrate of a first conductivity type a plurality of first regions of a second conductivity type adjacent to the top surface thereof, said second conductivity type being opposite said first conductivity type, said first regions of said second conductivity type being highly doped to provide a low resistivity to the passage of current;

forming an epitaxial layer of said second conductivity type on said substrate to a selected thickness, said first regions out-diffusing from said substrate into portions of said epitaxial layer during the growth of said epitaxial layer;

forming grooves in selected portions of said epitaxial layer;

forming channel stop regions of said first conductivity type in the bottom surfaces of said grooves, said channel stop regions of said first conductivity type having a higher dopant concentration than said substrate;

thermally oxidizing the epitaxial material exposed by said grooves, thereby to form regions of thermal oxide in said grooves, said regions of thermal oxide extending through said epitaxial layer into contact with said substrate thereby to form from said epitaxial layer a plurality of islands of semiconductor material, the lateral dimensions of each of said islands being defined by said regions of thermal oxide;

forming at least a first vertical transistor in a first one of said islands of semiconductor material and a second vertical transistor in a second one of said islands, said forming at least a first and a second vertical transistor comprising, forming a first region of said first conductivity type in said first island, a first portion of said first region serving as a first active base region of said first vertical transistor, and forming a first active base region of said first conductivity type in said second island serving as a first active base region of said second vertical transistor, the lateral extent of said first active base region of said first transistor being partially defined by a first portion of said thermal oxide, the lateral extent of said first active base region of said second vertical transistor being completely defined by a second portion of said thermal oxide, etching portions of the region of said thermal oxide adjacent said first base regions of said first and said second vertical transistors so as to expose additional portions of said semiconductor material in said first and second islands respectively, forming a first emitter region of said second conductivity type in said first active base region of said first transistor and a first emitter region of said second conductivity type in said first active base region of said second transistor, the lateral extent of said first emitter region of said first transistor being partially defined by said first portion of said thermal oxide, and the lateral extent of said first emitter region of said second transistor being completely defined by said second portion of said region of thermal oxide, ion implanting second active base regions beneath said first emitter regions of said first and said second vertical transistors and along said thermally grown oxide adjacent said first active base regions of said first and said second vertical transistors in order to increase the separation between said emitter regions and said collector regions adjacent said first and said second oxide positions respectively, in order to prevent $I_{CEO}$ leakage, ion implanting a third active base region beneath said first emitter region of said second vertical transistor so that the beta of said second vertical transistor with said third active base region is less than the beta of said first vertical transistor and so that the collector-emitter breakdown voltage with base open of said second vertical transistor with said third active base region is greater than the collector-emitter breakdown voltage with base open of said first vertical transistor, thereby to form a junction programmable transistor.

2. The method of claim 1 wherein said forming said first active base regions comprises ion implanting said first active base regions so that the impurity distributions of said first active base regions are the same.

3. The method of claim 1 further comprising forming a lateral transistor in a second portion of said first region of said first conductivity type in said first island.

4. The method of claim 1 wherein said ion implanting a third active base region causes the collector-base breakdown voltage with emitter open of said second vertical transistor to be at least 23 volts.

5. The method of claim 1 wherein said ion implanting a third active base region causes the collector-emitter breakdown voltage with base open of said second vertical transistor to be greater than 7.5 volts.

6. The method of claim 2 wherein said forming said first emitter regions comprises ion implanting said first emitter regions so that the impurity distribution of said emitter regions are the same.

7. The method of claim 2 wherein said ion implanting of said second active base regions is performed by a single ion implantation step after said first emitter regions are formed.

8. The method of claim 6 wherein said ion implanting of said first emitter regions is performed in a single ion implantation step.

* * * * *